United States Patent [19]

Miyajima

[11] Patent Number: 5,885,352

[45] Date of Patent: Mar. 23, 1999

[54] VAPOR PHASE PROCESSING APPARATUS

[75] Inventor: Hideshi Miyajima, Yokohama, Japan

[73] Assignee: Kabushiki Kaisha Toshiba, Kawasaki, Japan

[21] Appl. No.: 982,584

[22] Filed: Dec. 2, 1997

[30] Foreign Application Priority Data

Dec. 3, 1996  [JP]  Japan ................................. 8-322935

[51] Int. Cl.$^6$ ............................................. C23C 16/00

[52] U.S. Cl. ..................... 118/708; 118/712; 118/715; 118/723 R; 118/723 E

[58] Field of Search ...................... 118/708, 712, 118/715, 723 R, 723 E

[56] References Cited

U.S. PATENT DOCUMENTS

| | | | |
|---|---|---|---|
| 5,286,297 | 2/1994 | Moslehi | 118/723 E |
| 5,584,933 | 12/1996 | Saito | 118/712 |
| 5,728,253 | 3/1998 | Saito | 118/712 |

*Primary Examiner*—Richard Bueker
*Attorney, Agent, or Firm*—Finnegan, Henderson, Farabow, Garrett & Dunner, L.L.P.

[57] ABSTRACT

This invention provides a vapor phase processing apparatus which forms a film on a substrate by using a source gas, and includes a processing chamber for accommodating the substrate, a gas supply unit, having a gas supply hole, for supplying a source gas into the processing chamber, and a detection unit for detecting a degree of clogging of the gas supply holes.

28 Claims, 4 Drawing Sheets

VAPOR PHASE PROCESSING APPARATUS

BACKGROUND OF THE INVENTION

The present invention relates to a vapor phase processing apparatus for performing a vapor phase process, e.g., film formation, on a substrate, e.g., a semiconductor substrate, in accordance with CVD.

In a semiconductor device, a conductive or insulating thin film is formed on a substrate. As such an insulating film, for example, an $SiO_2$ thermal oxide film, or an $SiO_2$ film or SiN film formed by using a source gas, e.g., silane or tetraethoxysilane (TEOS), at a reduced or atmospheric pressure in accordance with chemical vapor deposition (CVD) is mainly used.

CVD is a film formation method which is widely used in the manufacture of a semiconductor device as a method of forming a conductive or insulating thin film on a substrate. In particular, plasma CVD is often used since it enables film formation at a comparatively low temperature.

In recent years, the diameter of a silicon wafer serving as the underlying layer of a semiconductor device increases. In general, a CVD apparatus used for forming a thin film on such a large-diameter silicon wafer uses, as a member which supplies a source gas, a dispersion nozzle having a plurality of source gas supply holes, so that a uniform thin film can be formed.

The diameter of the gas supply holes of the dispersion nozzle used in the CVD apparatus described above is very small (e.g., about 1 mm). A deposit tends to attach to the inner portions of the holes during a film formation process, causing clogging. If such clogging occurs, the gas supply amount onto the wafer becomes nonuniform. As a result, the film formation speed, the film composition, and the like on the wafer vary.

In order to decrease these variations, conventionally, every time a desired thin film is formed on one or a plurality of semiconductor substrates, the inner wall of the processing chamber or the dispersion nozzle is cleaned by using an etching gas, thereby removing the deposit. With this chemical interior cleaning, however, the deposit cannot sometimes be sufficiently removed. If the film formation process is repeated, the deposit is accumulated, and a sufficient cleaning effect cannot be obtained with only the chemical internal cleaning described above. Therefore, conventionally, not only chemical internal cleaning is performed, but also the processing chamber is opened, disassembled, and cleaned in the atmosphere periodically.

Conventionally, it has not been precisely grasped regarding to what extent the film formation process can be repeated until when chemical internal cleaning is to be performed (when chemical internal cleaning should be performed), how long chemical internal cleaning should be performed (when chemical internal cleaning should be ended), to what extent the film formation process can be repeated until when the processing chamber is to be opened, disassembled, and cleaned in the atmosphere (when disassembly and cleaning in the atmosphere should be performed). In other words, conventionally, these matters are determined based on the experience, the in-surface uniformity of the deposition speed of the film formed on the semiconductor substrate, and the like.

Therefore, much time has been conventionally spent on chemical internal cleaning, disassembly and cleaning, and the like. Conventionally, internal cleaning using an etching gas is excessively performed in order to prevent insufficient removal of the deposit. As a result, portions in the processing chamber that have low durability tend to be damaged, and damaged components must be exchanged often. Also, dust tends to be generated easily.

BRIEF SUMMARY OF THE INVENTION

It is an object of the present invention to provide a vapor phase processing apparatus having a gas supply hole for supplying a source gas and capable of appropriately grasping information concerning cleaning and the like.

According to the present invention, there is provided a vapor phase processing apparatus for forming a film on a substrate by using a source gas, comprising: a processing chamber for accommodating the substrate; gas supply means, having a gas supply hole, for supplying a source gas into the processing chamber; and detection means for detecting a degree of clogging of the gas supply hole.

According to the present invention, there is also provided a vapor phase processing apparatus for forming a film on a substrate by CVD using a source gas, comprising: a processing chamber for accommodating the substrate; gas supply means, having a gas supply hole, for supplying a source gas into the processing chamber; and detection means for detecting a degree of clogging of the gas supply hole.

According to the present invention, there is also provided a vapor phase processing apparatus for forming a film on a substrate by CVD using a source gas, comprising: a processing chamber for accommodating the substrate; a heater for heating the substrate accommodated in the processing chamber to a predetermined temperature; gas supply means, having a gas supply hole, for supplying a source gas into the processing chamber; plasma generating means for converting the source gas supplied into the processing chamber into a plasma; and detection means for detecting a degree of clogging of the gas supply hole.

According to the present invention, there is also provided a vapor phase processing apparatus using a chemical reaction of a process gas on a surface of a substrate, comprising: a processing chamber for accommodating the substrate; gas supply means, having a gas supply hole, for supplying a process gas into the processing chamber; and detection means for detecting a degree of clogging of the gas supply hole.

With the vapor phase processing apparatus according to the present invention, the state of the gas supply hole can be grasped accurately and quickly by the detection means that detects the degree of clogging of the gas supply hole. Accordingly, information concerning cleaning and the like, e.g., when to perform chemical cleaning of the interior of the processing chamber, when to end chemical cleaning of the interior of the processing chamber, and when to perform physical cleaning of the interior of the processing chamber can be grasped appropriately based on the detection result obtained by the detection means.

As the detection means, for example, one which detects a flow rate of the gas flowing through the gas supply means can be used. As the amount of deposit attaching to the gas supply hole increases, the flow rate (flow velocity) of the gas changes. Therefore, the degree of clogging can be grasped by constantly detecting the flow rate of the gas.

As the detection means, for example, one which detects an intensity of light observed through the gas supply hole can be used. As the amount of deposit attaching to the gas supply hole increases, the intensity of observed light changes. The degree of clogging can be grasped by constantly detecting the light intensity. When the vapor phase processing apparatus is a plasma CVD apparatus, as the light observed through the gas supply hole, light generated by plasma discharge in the processing chamber can be utilized.

In the vapor phase processing apparatus of the present invention, a plurality of gas supply holes are normally formed. In this case, if a plurality of detection means are provided, which gas supply hole starts to clog or clogs can be grasped. The plurality of detection means may detect the degree of clogging of the gas supply holes based on a single detection principle. Alternatively, the plurality of detection means may detect the degree of clogging of the gas supply holes based on a plurality of detection principles.

The vapor phase processing apparatus according to the present invention can further comprise determination means for performing determination concerning cleaning of an interior of the processing chamber based on the detection result obtained by the detection means. If the relationship between the detection result and the degree of clogging is studied in advance, the determination means can determine, e.g., (A) when to chemically clean the interior of the processing chamber, (B) when to end chemical cleaning of the interior of the processing chamber, and (C) when to physically clean the interior of the processing chamber based on the detection result obtained by the detection means.

When the items (A) to (C) are optimized by using the determination means, the following advantages can be obtained. For example, when (A) is optimized, excessive, frequent chemical cleaning of the interior of the apparatus need not be performed, so that the productivity can be improved.

When (B) is optimized, chemical cleaning need not be continued for an excessively long period of time. Not only the productivity can be improved, but also damage to the interior of the apparatus can be decreased. As a result, the service life of the components is prolonged to decrease the manufacturing cost, and generation of dust in the apparatus can be suppressed.

When (C) is optimized, whether physical cleaning should be performed or not can be determined accurately without measuring the state of the substrate surface after vapor phase processing every time the processing operation is performed. Accordingly, the productivity can be improved.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

A vapor phase processing apparatus according to the present invention will be described in more detail.

The first embodiment of the present invention will be described with reference to FIGS. 1 to 3. In the first embodiment, the present invention is applied to a plasma CVD apparatus.

Figure 1:
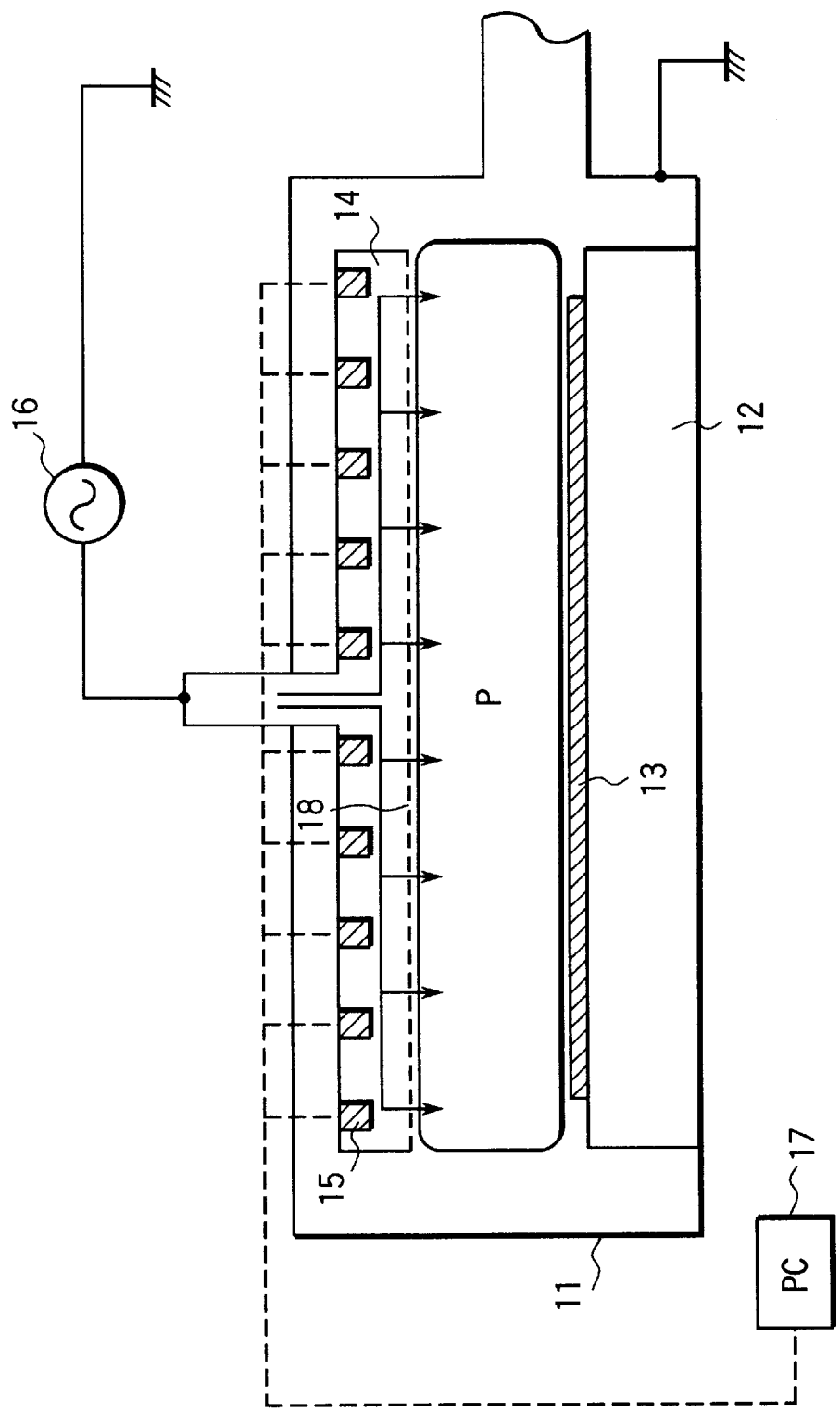
FIG. 1 is a sectional view schematically showing a vapor phase processing apparatus according to an embodiment of the present invention.

FIG. 1 is a sectional view of a vapor phase processing apparatus according to the first embodiment of the present invention. Referring to FIG. 1, a support table 12 for placing a semiconductor substrate 13, e.g., a silicon wafer thereon is arranged in the lower portion of a processing chamber 11. A heater is incorporated in the support table 12 in order to heat the semiconductor substrate 13 to a predetermined temperature.

A dispersion nozzle 14 for dispersing a source gas into the processing chamber 11 is arranged in the upper portion of the processing chamber 11. The source gas is supplied into the processing chamber 11 from a pipe (not shown). A plurality of gas supply holes 18 for dispersing the source gas, supplied to the dispersion nozzle 14, into the processing chamber 11 are formed in the lower surface of the dispersion nozzle 14.

The dispersion nozzle 14 also serves as an upper electrode, and is connected to an high frequency power supply 16. A plasma region P can be formed in the processing chamber 11 by supplying a predetermined high frequency power from the high frequency power supply 16 to the dispersion nozzle 14 while supplying the source gas into the processing chamber 11.

A plurality of flow rate sensors 15 are arranged inside the upper surface of the dispersion nozzle 14. These flow rate sensors 15 detect the flow rate (flow velocity) of the source gas flowing in the dispersion nozzle 14. These flow rate sensors 15 are connected to a personal computer 17. The detection results of the respective flow rate sensors 15 are input to the personal computer 17. The personal computer 17 recognizes the state of the gas supply holes 18 and makes determination concerning cleaning of the interior of the processing chamber 11.

Figure 2:
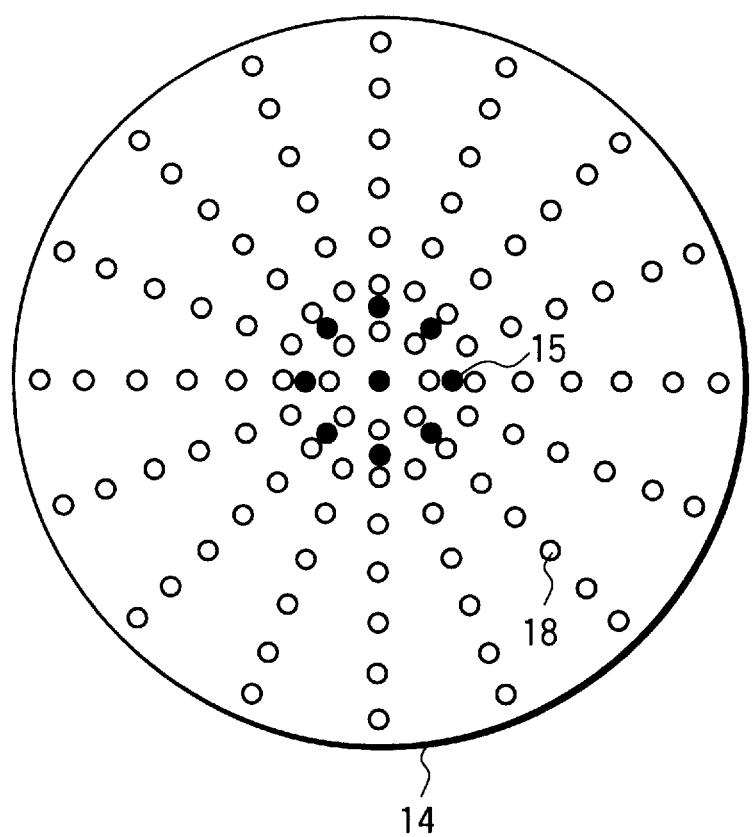
FIG. 2 is a view schematically showing a dispersion nozzle used in the vapor phase processing apparatus according to the embodiment of the present invention.

FIG. 2 shows an example of the dispersion nozzle 14 used in the vapor phase processing apparatus according to the first embodiment of the present invention. FIG. 2 schematically shows the internal structure of the dispersion nozzle 14. In the dispersion nozzle 14 shown in FIG. 2, the plurality of gas supply holes 18 are concentrically arranged. The eight flow rate sensors 15 are also arranged concentrically with the circles formed by the plurality of gas supply holes 18. The number and positions of the flow rate sensors 15 can be appropriately changed as required.

The operation of the vapor phase processing apparatus according to the first embodiment of the present invention will be described with reference to FIG. 1.

The semiconductor substrate 13 is placed on the support table 12, and is heated in advance to, e.g., 350° C., by the heater arranged in the support table 12. A source gas, e.g., $TEOS/O_2$ gas is introduced into the dispersion nozzle 14 from the pipe (not shown) at flow rates of 50 sccm for TEOS gas and 200 sccm for $O_2$ gas. The source gas is then supplied into the processing chamber 11 through the gas supply holes 18 formed in the dispersion nozzle 14.

At this time, along with supply of the source gas, high frequency power (e.g., 13.56 MHz, 850 W) is supplied from the high frequency power supply 16 to the dispersion nozzle 14 serving also as the upper electrode. Consequently, the plasma region P is formed in the processing chamber 11, and a film, e.g., an $SiO_2$ film, is formed on the semiconductor substrate 13.

Along with film formation described above, the flow rates of the source gas in the dispersion nozzle 14 are detected by the flow rate sensors 15 respectively. The detection result is processed by the personal computer 17 instantaneously.

As film formation continues, a deposit attaches to the gas supply holes 18 formed in the dispersion nozzle 14 to change the flow rate of the source gas. By processing the detection result obtained from the respective flow rate sensors 15 with the personal computer 17, a specific gas supply hole 18 which causes the clogging can be identified and the degree of the clogging can be shown while continuing film formation. The personal computer 17 is set to determine that internal cleaning is required when, e.g., the flow rate detected by the flow rate sensors 15 becomes a value equal to or smaller than a predetermined value.

Figure 3:
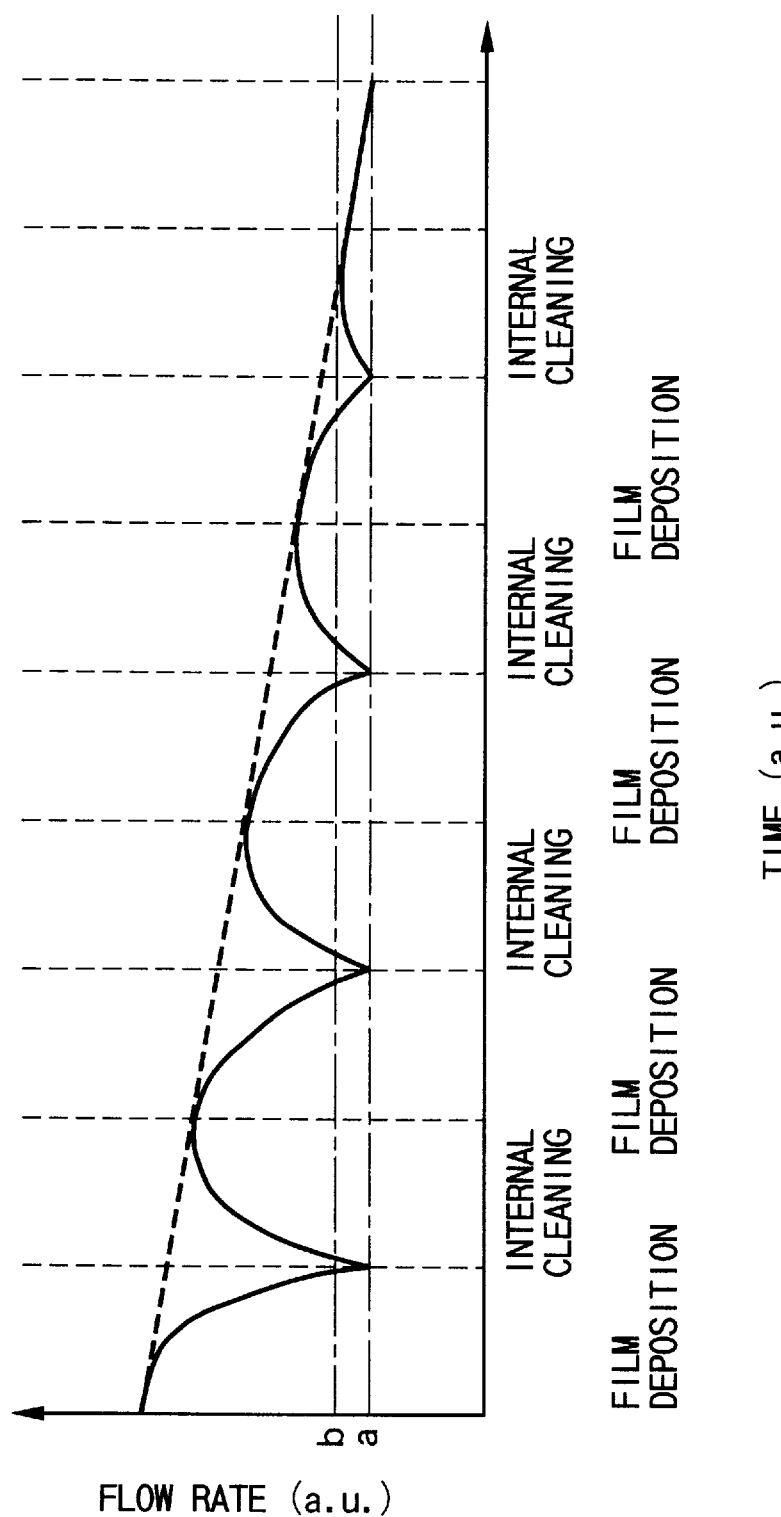
FIG. 3 is a graph schematically showing film formation and the cleaning process of the vapor phase processing apparatus according to the embodiment of the present invention.

FIG. 3 shows a graph showing the relationship between the film formation/cleaning process performed by using the vapor phase processing apparatus according to the first embodiment of the present invention and the flow rate of the source gas detected by the flow rate sensors 15. Referring to FIG. 3, the abscissa represents film formation/cleaning time, and the ordinate represents the flow rate of the source gas detected by the flow rate sensors 15.

As shown in FIG. 3, as film formation continues, deposits attach to the gas supply holes 18 formed in the dispersion nozzle 14, then the flow rate detected by the flow rate sensors 15 gradually decreases. When the flow rate detected by the flow rate sensors 15 becomes equal to or smaller than a lower limit $F_a$ preset in the personal computer 17, the personal computer 17 determines that chemical cleaning is required.

Chemical cleaning is performed by utilizing a plasma formed by a gas, e.g., $CF_4/O_2$, containing a halogen, or an etching gas, e.g., HF, without opening the processing chamber 11 but keeping it closed.

As chemical internal cleaning progresses, usually, the deposits attaching to the gas supply holes 18 is gradually removed. As a result, the flow rates detected by the flow rate sensors 15 gradually increase. If the relationship between the flow rate detected by the flow rate sensor 15 and the degree of clogging is studied and is stored in the personal computer 17 in advance, chemical internal cleaning can be ended at an optimum time point.

With chemical internal cleaning, however, the deposit attaching to the gas supply holes 18 cannot sometimes be completely removed. In this case, if film formation and chemical cleaning are repeated, the deposit is undesirably accumulated in the gas supply holes 18. Then, as shown in FIG. 3, the flow rate gradually decreases, and a high flow rate cannot be obtained even immediately after chemical internal cleaning is performed. In other words, physical cleaning becomes necessary.

For such a case, an allowable lower limit $F_b$ of the flow rate immediately after chemical internal cleaning is preset in the personal computer 17. If the flow rate immediately after chemical internal cleaning becomes less than $F_b$, the personal computer 17 determines that physical cleaning is required. Thus, physical cleaning can be performed at appropriate time.

This physical cleaning is performed by, e.g., opening the processing chamber and wiping off the deposit in the atmosphere. When performing physical cleaning, the members in the apparatus are disassembled as required. At this time, cleaning may be performed by employing chemicals as well. If necessary, exchange of components and the like are performed.

In this manner, if the relationship between the flow rate detected by the flow rate sensors 15 and the degree of clogging of the gas supply holes 18 is studied and is stored in the personal computer 17 in advance, (A) when to perform chemical internal cleaning of the processing chamber 11, (B) when to end chemical internal cleaning of the processing chamber 11, and (C) when to perform physical cleaning of the processing chamber 11 can be grasped appropriately.

A vapor phase processing apparatus according to the second embodiment of the present invention will be described.

Figure 4:
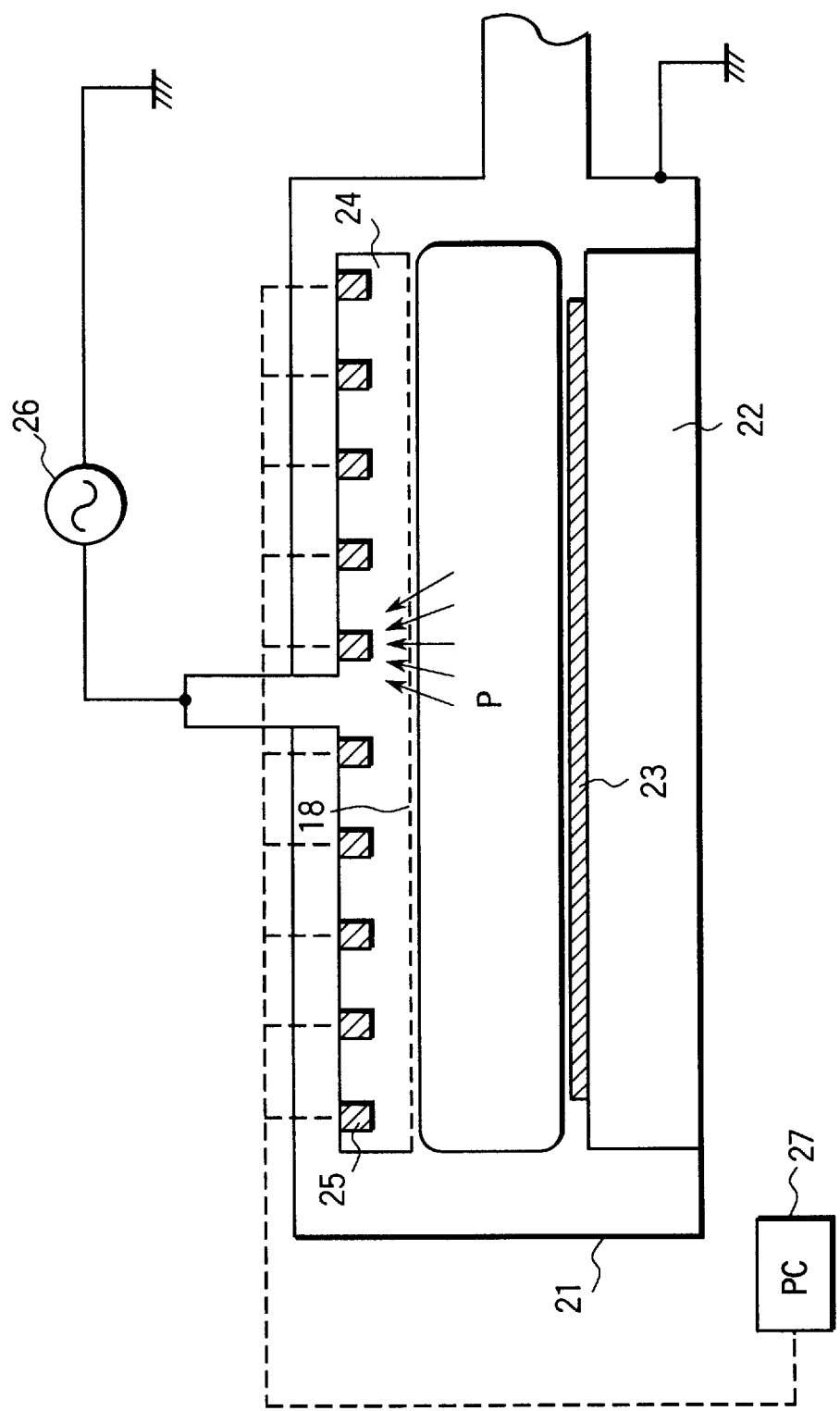
FIG. 4 is a sectional view schematically showing a vapor phase processing apparatus according to another embodiment of the present invention.

FIG. 4 is a sectional view of the vapor phase processing apparatus according to the second embodiment of the present invention. In the second embodiment, the present invention is applied to a plasma CVD apparatus in the same manner as in the first embodiment.

In the second embodiment of the present invention, the degree of clogging of the gas supply holes formed in the dispersion nozzle is detected by using photosensors. Except for this, the second embodiment is substantially the same as the first embodiment. Accordingly, a description on matters that are similar to those in the first embodiment or can be easily estimated from the first embodiment is omitted unless otherwise specified.

The vapor phase processing apparatus shown in FIG. 4 is different from that shown in FIG. 1 only in that it uses photosensors 25 in place of the flow rate sensors 15.

More specifically, referring to FIG. 4, in a processing chamber 21, a support table 22 for placing a semiconductor substrate 23 thereon, and a dispersion nozzle 24 opposing to the support table 22 and having a plurality of gas supply holes 28 are arranged. The dispersion nozzle 24 is connected to an high frequency power supply 26, and also serves as an upper electrode.

The plurality of photosensors 25 are arranged inside the upper surface of the dispersion nozzle 24. These photosensors 25 detect the intensity of light emerging from a plasma region P and observed through the gas supply holes 28, and are connected to a personal computer 27.

The operation of the vapor phase processing apparatus according to the second embodiment of the present invention will be described.

The semiconductor substrate 23 is placed on the support table 22, and is heated in advance to, e.g., 350° C., by a heater arranged in the support table 22. A source gas, e.g., $TEOS/O_2$ gas, is introduced into the dispersion nozzle 24 from pipes (not shown) at flow rates of 50 sccm for TEOS gas and 200 sccm for $O_2$ gas. The source gas is then supplied into the processing chamber 21 through the gas supply holes 28 formed in the dispersion nozzle 24.

At this time, along with supply of the source gas, high frequency power (e.g., 13.56 MHz, 850 W) is supplied from the high frequency power supply 26 to the dispersion nozzle 24 serving also as the upper electrode. This forms the plasma region P in the processing chamber 21, and a film, e.g., an $SiO_2$ film, is formed on the semiconductor substrate 23.

Along with film formation described above, the degree of clogging of the gas supply holes 28 is detected by utilizing light generated in the plasma region P. The intensity of light transmitted through the gas supply holes 28 changes in accordance with the amount of deposit attaching to the gas supply holes 28. Accordingly, the degree of clogging can be detected by detecting, with the photosensors 25, the components of light from the plasma region P, which are transmitted through the gas supply holes 28. The detection result obtained in this manner is processed by the personal computer 27 instantaneously.

As film formation continues, a deposit attaches to the gas supply holes 28 formed in the dispersion nozzle 24 to change the intensity of light which is transmitted through each gas supply hole 28. By processing the detection result obtained from the respective photosensors 25 with the personal computer 27, a specific gas supply hole 28 which causes the clogging can be identified and the degree of the clogging can be shown while continuing film formation.

Subsequently, film formation and cleaning are performed in the same manner as those described in the first embodiment with reference to FIG. 3. More specifically, the relationship between the light intensity detected by the photosensors 25 and the degree of clogging of the gas supply holes 28 is studied and is stored in the personal computer 27 in advance. Then, (A) when to perform chemical internal cleaning of the processing chamber 21, (B) when to end chemical internal cleaning of the processing chamber 21, and (C) when to perform physical cleaning of the processing chamber 21 can be grasped appropriately.

In the first and second embodiments described above, when (A) is optimized, excessive, frequent chemical cleaning of the interior of the apparatus need not be performed, so that the productivity can be improved. When (B) is optimized, chemical cleaning need not be continued for an excessively long period of time. Not only the productivity can be improved, but also damage to the interior of the apparatus can be decreased. As a result, the service life of the component is prolonged to decrease the manufacturing cost, and generation of dust in the apparatus can be suppressed. When (C) is optimized, whether physical cleaning should be performed or not can be determined accurately without measuring the state of the substrate surface after vapor phase processing every time the processing operation is performed. Accordingly, the productivity can be improved.

In the first and second embodiments, the present invention is applied to a plasma CVD apparatus. However, the present invention can be applied to any CVD apparatuses, e.g., a thermal CVD apparatus, a optical CVD apparatus, and the like. In the second embodiment of the present invention, the degree of clogging of the gas supply holes 28 is detected by utilizing light generated by plasma discharge. However, any other light source can be utilized as far as it generates light having a substantially constant intensity. For example, light from a heater or lamp used for heating the substrate, light from the light-emitting source of optical CVD, or the like can be utilized. Alternatively, a separate light source may be provided.

In the first and second embodiments, as the dispersion nozzle, other than a disk-like dispersion nozzle, those having various shapes can be used, e.g., a rod-like dispersion nozzle or an arcuated dispersion nozzle. The CVD apparatus can be of a single wafer processing type or of a batch processing type.

The degree of clogging is detected by the flow rate sensors in the first embodiment, and by the photosensors in the second embodiment. However, the degree of clogging can be detected by employing other detection principles.

In the first and second embodiments, detection of the degree of clogging is performed by arranging a plurality of sensors that are driven by one detection principle. However, sensors that are driven by different detection principles may be used. For example, flow rate sensors, photosensors, and the like can be used in combination. When sensors that are driven by different detection principles are used in this manner, the degree of clogging can be detected with higher precision.

Although, cases wherein the present invention is applied to a CVD apparatus have been described so far, the present invention can also be applied to other vapor phase processing apparatuses, e.g., a dry etching apparatus. In the dry etching apparatus, unlike in the CVD apparatus, no source gas is supplied, but an etching gas, e.g., HF, is supplied instead as the process gas. Accordingly, the reaction product of the source gas does not attach to the gas supply holes of the dispersion nozzle as the deposit.

Sometimes, a reaction product or the like generated by chemical reaction of the substrate or the like and the etching gas attaches to the gas supply holes of the dispersion nozzle in the form of a deposit. For this reason, cleaning identical to that performed in the CVD apparatus need be performed in the dry etching apparatus as well to remove the deposit.

When the present invention is applied to other vapor phase processing apparatuses as well, e.g., a dry etching apparatus, cleaning can be performed appropriately, and the same effect as that obtained when the present invention is applied to the CVD apparatus can be applied.

As has been described above, with the vapor phase processing apparatus according to the present invention, the state of the gas supply holes can be grasped accurately and quickly by a detection means that detects the degree of clogging of the gas supply holes, and information concerning cleaning (e.g., when to perform chemical cleaning, when to end chemical cleaning, and when to perform physical cleaning) can be grasped appropriately. As a result, cleaning can be performed appropriately, thereby improving the productivity, reducing the manufacturing cost, and decreasing the dust.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

I claim:

1. A vapor phase processing apparatus for forming a film on a substrate by using a source gas, comprising:
    a processing chamber for accommodating the substrate;
    gas supply means, having a gas supply hole, for supplying a source gas into said processing chamber; and
    detection means for detecting a degree of clogging of said gas supply holes.

2. An apparatus according to claim 1, wherein the substrate is a semiconductor substrate.

3. An apparatus according to claim 2, wherein said gas supply means comprises a plurality of gas supply holes.

4. An apparatus according to claim 1, wherein said detection means detects a flow rate of the gas flowing through said gas supply means.

5. An apparatus according to claim 1, wherein said detection means detects an intensity of light observed through said gas supply hole.

6. An apparatus according to claim 5, wherein the light observed through said gas supply hole is light of a plasma generated in said processing chamber.

7. An apparatus according to claim 3, wherein a plurality of detection means are provided.

8. An apparatus according to claim 7, wherein said plurality of detection means detect the degree of clogging of said gas supply holes based on a single detection principle.

9. An apparatus according to claim 7, wherein at least one of said plurality of detection means detects the degree of clogging of said gas supply hole based on a detection principle different from that of the remaining ones of said plurality of detection means.

10. An apparatus according to claim 1, further comprising determination means for performing determination concerning cleaning of an interior of said processing chamber based on a detection result obtained from said detection means.

11. An apparatus according to claim 10, wherein said determination means determines when to chemically clean said interior of said processing chamber based on the detection result obtained from said detection means.

12. An apparatus according to claim 10, wherein said determination means determines when to stop chemical cleaning of said interior of said processing chamber based on the detection result obtained from said detection means.

13. An apparatus according to claim 10, wherein said determination means determines when to physically clean said interior of said processing chamber based on the detection result obtained from said detection means.

14. A vapor phase processing apparatus for forming a film on a substrate by CVD using a source gas, comprising:

a processing chamber for accommodating the substrate;

gas supply means, having a gas supply hole, for supplying a source gas into said processing chamber; and detection means for detecting a degree of clogging of said gas supply holes.

15. An apparatus according to claim 14, wherein the substrate is a semiconductor substrate.

16. An apparatus according to claim 14, wherein said gas supply means comprises a plurality of gas supply holes.

17. An apparatus according to claim 14, wherein said detection means detects a flow rate of the gas flowing through said gas supply means.

18. An apparatus according to claim 14, wherein said detection means detects an intensity of light observed through said gas supply hole.

19. An apparatus according to claim 18, wherein the light observed through said gas supply hole is light of a plasma generated in said processing chamber.

20. An apparatus according to claim 16, wherein a plurality of detection means are provided.

21. An apparatus according to claim 20, wherein said plurality of detection means detect the degree of clogging of said gas supply holes based on a single detection principle.

22. An apparatus according to claim 20, wherein at least one of said plurality of detection means detects the degree of clogging of said gas supply hole based on a detection principle different from that of the remaining ones of said plurality of detection means.

23. An apparatus according to claim 14, further comprising determination means for performing determination concerning cleaning of an interior of said processing chamber based on a detection result obtained from said detection means.

24. An apparatus according to claim 23, wherein said determination means determines when to chemically clean said interior of said processing chamber based on the detection result obtained from said detection means.

25. An apparatus according to claim 23, wherein said determination means determines when to stop chemical cleaning of said interior of said processing chamber based on the detection result obtained from said detection means.

26. An apparatus according to claim 23, wherein said determination means determines when to physically clean said interior of said processing chamber based on the detection result obtained from said detection means.

27. A vapor phase processing apparatus for forming a film on a substrate by CVD using a source gas, comprising:

a processing chamber for accommodating the substrate;

a heater for heating the substrate accommodated in said processing chamber to a predetermined temperature;

gas supply means, having a gas supply hole, for supplying a source gas into said processing chamber;

plasma generating means for converting the source gas supplied into said processing chamber into a plasma; and detection means for detecting a degree of clogging of said gas supply hole.

28. A vapor phase processing apparatus for performing a vapor phase process on a surface of a substrate by using a chemical reaction of a process gas on the surface of the substrate, comprising:

a processing chamber for accommodating the substrate;

gas supply means, having a gas supply hole, for supplying a process gas into said processing chamber; and detection means for detecting a degree of clogging of said gas supply holes.

* * * * *